United States Patent [19]

Ikeya et al.

[11] Patent Number: 4,572,853

[45] Date of Patent: Feb. 25, 1986

[54] RESIN ENCAPSULATION TYPE SEMICONDUCTOR DEVICE

[75] Inventors: Hirotoshi Ikeya, Yokosuka; Shuichi Suzuki, Yokohama; Takayuki Oguni, Yokohama; Kazutaka Matsumoto, Yokohama; Akiko Hatanaka, Yokohama, all of Japan

[73] Assignee: Tokyo Shibaura Denki Kabushiki Kaisha, Kawasaki, Japan

[21] Appl. No.: 580,299

[22] Filed: Feb. 21, 1984

Related U.S. Application Data

[63] Continuation of Ser. No. 268,324, May 29, 1981, abandoned.

[30] Foreign Application Priority Data

Jun. 5, 1980 [JP] Japan ................................. 55-74943
May 8, 1981 [JP] Japan ................................. 56-68374

[51] Int. Cl.$^4$ ...................... B32B 27/38; H01B 7/08
[52] U.S. Cl. ...................................... 428/76; 428/414; 428/417; 428/325; 428/451; 426/460; 426/524; 174/110 SR; 174/52 PE; 357/72; 357/40
[58] Field of Search ............... 428/76, 417, 414, 325, 428/460, 524, 451

[56] References Cited

U.S. PATENT DOCUMENTS

| | | | |
|---|---|---|---|
| 2,768,153 | 10/1956 | Shokal | 260/47 |
| 3,749,601 | 7/1973 | Tittle | 428/414 X |
| 4,075,420 | 2/1978 | Walton | 428/414 X |
| 4,370,465 | 1/1983 | Whiteside, Jr. et al. | 428/414 X |

FOREIGN PATENT DOCUMENTS

| | | |
|---|---|---|
| 2841751 | 4/1979 | Fed. Rep. of Germany . |
| 47-14148 | 1/1972 | Japan . |

OTHER PUBLICATIONS

Lee et al., "Reaction of Epoxides," *Handbook of Epoxy Resins,* Appendix 5-1, 1967.
Kitamura et al., "Resin Composition for Semi-Conductor Shielding," Chemical Abstracts, vol. 83, p. 66, col. 1, abstract No. 11754p, 1975.
Kitamura et al., "Moisture-Resistant Epoxy Resin Compositions for Resin-Molded Semiconductor Devices," *Chemical Abstracts,* vol. 84, p. 460, cols. 1 and 2, abstract No. 11505d, 1976.
Certified copy of U.S. patent application Ser. No. 700,726 (corresponding to Japanese patent publication No. 4714148) (1972).

*Primary Examiner*—Patricia C. Ives
*Attorney, Agent, or Firm*—Schwartz, Jeffery, Schwaab, Mack, Blumenthal & Evans

[57] ABSTRACT

There is presented a highly reliable resin encapsulation type semiconductor device excellent in humidity resistance as well as high temperature electrical characteristics. The specific feature consists in the epoxy resin composition employed for encapsulation. This composition comprises an epoxy resin, a novolac resin as curing agent and an organic tertiary phosphine compound as curing accelerator. The resin encapsulation type semiconductor device is markedly small in leak current under hot and humid conditions and has a prolonged life due to difficult deterioration through corrosion of electrodes and aluminum wiring, as compared with those of prior art.

12 Claims, No Drawings

RESIN ENCAPSULATION TYPE SEMICONDUCTOR DEVICE

This application is a continuation of application Ser. No. 268,324, filed May 29, 1981, now abandoned.

BACKGROUND TO THE INVENTION

This invention relates to a resin encapsulation type semiconductor device, particularly to a semiconductor device encapsulated within an epoxy resin composition comprising an epoxy resin, a novolac resin curing agent and an organic tertiary phosphine compound.

Epoxy resins have widely been used as highly reliable electrical insulating materials for their excellent electrical properties, mechanical properties and humidity resistance for encapsulation of impregnation of semiconductor devices, electronic parts as well as electrical parts. In particular, most semiconductor devices, including integrated circuits, large scale integrated circuits, transistors and diodes are encapsulated using epoxy resin compositions for low pressure molding. The conventional epoxy resin compositions for electrical insulating materials have been most generally used by curing an epoxy resin with a curing agent such as a polyamine, an acid anhydride or a phenol resin together with a curing accelerator such as a tertiary amine or an imidazole. Particularly, in the field of encapsulation of semiconductor devices, there has been used an epoxy resin composition comprising an epoxy resin, a novolac resin curing agent, and an imidazole curing accelerator, which is the most excellent in various respects such as humidity resistance, reliability and moldability, as disclosed in U.S. Pat. No. 3,493,630. The semiconductor device encapsulated within such an epoxy resin composition can advantageously be produced at low cost and on a large scale, as compared with those encapsulated within metals or ceramics. On the other hand, it is inferior in humidity resistance and electrical properties at high temperatures. An encapsulated semiconductor device may sometimes be used or stored under conditions of high temperature and/or high humidity. When an epoxy resin encapsulation type semiconductor device is used at a high temperature and high humidity, electrical insulation of the semiconductor device may be lowered lowering its performance, for example, by increasing leak current or cause corrosion of aluminium electrodes or wiring, sometimes leading to failure or break down of wiring. Also, when it is used at a high temperature, there may be a deterioration of electrical properties of encapsulting resin, such as volume resistivity, which also results in an increase of leak current. In particular, semiconductor elements having a highly sensitive MOS structure on the surface or having a PN junction to which reverse bias is applied, suffers frequently from such inconveniences as increase leak current through channeling.

The inferior humidity resistance of an epoxy resin encapsulation type semiconductor device may be due to hygroscopicity or water permeability possessed by a cured epoxy resin on one hand, while it may also be due to hydrolyzable chlorine or ionic impurities contained in cured resin composition on the other. The latter hydrolyzable chlorine and ionic impurities inevitably remain because of the manufacturing technique employed. When moisture permeates into encapsulating resin, it may be associated with chlorine ions or other ionic impurities, whereby the insulating property of the device may suffer or corrosion of electrodes may result.

On the other hand, decrease of electrical properties at higher temperatures may be considered to be due to activated thermal motion of ionic impurities or polar substances contained in minute amounts in encapsulating resins. Particularly, when a voltage is applied on a semiconductor device, motion of ionic impurities or polar substances will be activated by the influence of electric field, whereby marked lowering in electrical properties may locally occur.

Especially under hot and humid conditions, there may occur complex reactions between humidity, ionic impurities, etc. and the action of the electric field, to thereby damage the characteristics of semiconductor devices, cause the device to deteriorate, and shorten its life.

In order to improve humidity resistance of an epoxy resin encapsulation type semiconductor device or to improve electrical characteristics thereof at higher temperatures, one can consider that hydrolyzable chlorine or ionic impurities should be removed. But it is practically impossible to remove these impurities completely for the reasons mentioned above.

For evaluation of humidity resistance of a resin encapsulation type semiconductor device, there may be employed a method such as the pressure cooker test (PCT), in which a device is exposed to a saturated water vapor at 85° C. or 120° C. for examination of the extent of deterioration of aluminum wiring through corrosion, or the bias-pressure cooker test (bias-PCT), in which a device on which voltage is applied is exposed to a hot saturated water vapor. On the other hand, for evaluation of electrical characteristics at high temperatures, there is generally employed the so called Bias-Temperature test (BT test), in which the quantity of leak current is examined by application of a bias voltage at a temperature from 80° C. to 150° C.

SUMMARY OF THE INVENTION

The principal object of the present invention is to provide an epoxy resin encapsulation type semiconductor device having improved humidity resistance and high temperature electrical characteristics and being high in reliability.

Another object of the present invention is to provide a resin encapsulation type semiconductor device encapsulated within a cured epoxy resin which itself displays excellent high temperature electrical characteristics (e.g. volume resistivity).

Still another object of the present invention is to provide a resin encapsulation type semiconductor device having prolonged life due to high resistance to higher temperatures and humidity.

Other objects of the present invention will be apparent from the following description as well as the Examples.

DETAILED DESCRIPTION OF PREFERRED EMBODIMENTS

The present invention provides a resin encapsulation type semiconductor device comprising a semiconductor device encapsulated within a cured epoxy resin composition, being characterized in that said epoxy resin composition comprises an epoxy resin, a novolac resin containing phenolic hydroxyl groups at a ratio of about 0.5 to about 1.5 relative to the epoxy groups possessed by said epoxy resin, and 0.001 to 20 parts by weight of an organic tertiary phosphine compound per 100 parts by weight of the resin component consisting of said epoxy resin and said novolac resin.

The resin encapsulation type semiconductor device of the present invention is excellent in humidity resistance and high temperature electrical properties. When it is used or stored at high temperatures under high humidity, it resists deterioration and has advantages of longer life and higher reliability than the prior art products.

The epoxy resin to be used in the present invention is not particularly limited, but any resin known in the art can be employed. Typical epoxy resins are those having two or more epoxy groups per one molecule, including glycidyl ether type epoxy resins such as a bisphenol A type epoxy resin, a phenol novolac type epoxy resin, a cresol novolac type epoxy resin, etc., glycidyl ester type epoxy resins, glycidyl amine type epoxy resins, linear aliphatic epoxy resins, alicyclic epoxy resins, heterocyclic type epoxy resins, halogen-containing epoxy resins, and so on. These epoxy resins may be employed either as single species or a mixture of two or more species. These epoxy resins may also desirably contain a chlorine ion of less than 10 ppm and a hydrolyzable chlorine of less than 0.1% by weight.

Among the epoxy resins as mentioned above, is most preferred a glycidyl ether type epoxy resin. Above all, most excellent characteristics can be obtained when there is employed a novolac type epoxy resin having an epoxy equivalent of 170 to 300. Such a novolac type epoxy resin may be exemplified by a phenol novolac type epoxy resin, a cresol novolac type epoxy resin, etc. which may be used either singly or in mixtures.

In carrying out low pressure transfer molding, an epoxy resin may preferably have a softening point of 60° to 120° C.

When a halogen-containing epoxy resin is added as an epoxy resin component in a small amount in the composition, the resultant composition can be improved in flame retardant property. It is also possible to impart flexibility to the composition by adding a linear aliphatic epoxy resin thereto.

The novolac resin to be used in the present invention functions as a curing agent and may include, for example, a phenol novolac resin, a cresol novolac resin, a tert-butyl phenol novolac resin, a nonylphenol novolac resin and the like. These novolac resins may have a softening point desirably of 60° to 120° C. for performing low pressure transfer molding. It is also desirable that the content of a water-soluble component at normal temperature should be 3% by weight or less. When an excessive amount of water-soluble components is contained in the composition, the resultant cured resin will be lowered in electrical properties.

The amount of the novolac resin to be formulated in the composition is required to be in the range from about 0.5 to about 1.5 in terms of the ratio of the phenolic hydroxyl groups possessed by the novolac resin to the epoxy groups possessed by the epoxy resin (number of hydroxyl groups/number of epoxy groups). Above all, when the epoxy groups exceed the phenolic hydroxyl groups in number, namely when the above ratio is 0.5 or more and less than 1, there can be obtained a composition excellent in both humidity resistance and high temperature electrical characteristics. The best characteristics can be obtained when said ratio is in the range from 0.77 to 0.95.

As the organic groups possessed by the organic tertiary phosphine compound specifically employed in the present invention, there may be mentioned an alkyl group such as methyl, butyl, octyl, hexadecyl and the like; a cycloalkyl group such as cyclohexyl, cyclopentyl, cyclopropyl and the like; an aryl group such as phenyl, o-chlorophenyl, p-chlorophenyl, methoxyphenyl, pentachlorophenyl, m-tolyl, p-tolyl, naphthyl and the like; an aralkyl group such as benzyl, phenylethyl and the like; and an organic group having an organic phosphino group such as an organic phosphinoalkyl, e.g., diphenylphosphinomethyl, diphenylphosphinoethyl, diphenylphosphinobutyl, diphenylphosphinodecyl, etc., and the like. Typical organic tertiary phosphine may include, for example, tricyclohexylphosphine, tributylphosphine, methyldiphenylphosphine, dibutylphenylphosphine, diphenylbutylphosphine, as well as bis(diphenylphosphino)alkane of which alkane moiety having 1 to 20 carbon atoms, such as 1,2-bis(diphenylphosphino)ethane, bis(diphenylphosphino)methane, and the like. There are also included in the organic tertiary phosphine a triarylphosphine such as triphenylphosphine, tri(p-methoxyphenyl)phosphine, tri(m-tolyl)phosphine, tri(p-tolyl)phosphine, trinaphthylphosphine, tri(p-chlorophenyl)phosphine, and the like.

Among the organic tertiary phosphine compounds as mentioned above, most excellent characteristics can be obtained when there is employed an arylphosphine such as a triarylphosphine, a diarylmonoalkylphosphine and a bis(diarylphosphino)alkane (alkane moiety having 1 to 20 carbon atoms). Above all, triphenylphosphine, 1,2-bis(diphenylphosphino)ethane and bis(diphenylphosphino)methane are preferred.

It is essentially required to add an tertiary organic phosphine compound in an amount of 0.001 to 20 parts by weight, preferably 0.01 to 5 parts by weight, based on 100 parts by weight of the resin component (epoxy resin and novolac resin).

Having thus described about the essential components in the epoxy resin composition to be used for the resin encapsulation type semiconductor device according to the present invention, it should also be noted that there may also optionally be added in the composition conventional fillers or various additives known in the art.

In the following, description is made of other components which can optionally be added according to conventional formulations.

The composition of the present invention containing no inorganic filler may be used for encapsulation of semiconductor devices such as integrated circuits, large scale integrated circuits, transistors and diodes according to methods such as cast molding or coating. When an inorganic filler is added to the composition, there can be obtained an epoxy resin composition improved in processability. In particular, when it is used as a molding compound, there is a conspicuous improvement of thermal-mechanical characteristics.

Typical examples of inorganic fillers may include quartz glass powders, crystalline silica powders, glass fibers, talc, alumina powders, calcium silicate powders, calcium carbonate powders, barium sulfate powders and magnesia powders and so on. Among them quartz glass powders and crystalline silica powders are most preferred. The proportions of these inorganic fillers, which may differ for different uses, resin components (epoxy resin and curing agent for epoxy resin), and any, inorganic fillers employed may be about 150 to 400 parts by weight per 100 parts of the resin components when used in, for example, transfer molding method. When the composition is to be used for transfer molding method, it is possible to prepare a molding compound with good characteristics by selection of inorganic fillers having a suitable particle size distribution.

A composition containing inorganic fillers is suitable for encapsulation of semiconductor devices such as integrated circuits, large scale integrated circuits, transistors and diodes according to the transfer molding method.

Further, if desired, the epoxy resin composition according to the present invention may also contain mold release agents such as natural waxes, synthetic waxes, metal salts of straight chain aliphatic acids, acid amides, esters or paraffins, flame retardants such as chlorinated paraffin, bromotoluene, hexabromobenzene, antimony trioxide or the like, colorants such as carbon black, silane coupling agents or other suitable additives.

In general, the epoxy resin composition according to the present invention can be prepared by mixing thoroughly the starting components at predetermined ratios, then further fusion mixing the resultant blend on a heated roll mill or mixing by means of a kneader to obtain easily an epoxy resin molding compound.

The resin encapsulation type semiconductor device according to the present invention can readily be prepared by encapsulating a semiconductor device using the above epoxy resin composition. As the most general method for encapsulation, there may be mentioned the low pressure transfer molding method, but encapsulation can also be effected by other methods such as injection molding, compression molding and cast molding. As special encapsulation methods, there may also be employed a method in which the semiconductor surface is coated with a solvent type or non-solvent type composition. Alternatively, local encapsulation such as so-called junction coating may also be available. The epoxy resin composition is cured at the time of encapsulation to provide finally a resin encapsulation type semiconductor device encapsulated within a cured product of this composition. Curing may be effected by heating desirably at a temperature of 150° C. or higher.

The semiconductor referred to in the present invention is not particularly limited but inclusive of integrated circuits, large scale integrated circuits, transistors, thyristors and diodes.

According to the present invention, there can be provided a resin encapsulation type semiconductor device having excellent characteristics as well as reliability as mentioned in detail below.

First of all, the resin encapsulation type semiconductor device according to the present invention is excellent in humidity resistance and therefore markedly decreased in failures of aluminum wiring or electrodes in semiconductor device through corrosion or leak current failure due to moisture when used under hot and humid conditions. Moreover, reliability can be guaranteed for a long term.

Secondly, the resin encapsulation type semiconductor device according to the invention is also excellent in high temperature electrical characteristics. When used at a high temperature or under high temperature state brought about locally by generation of heat, leak current failure as well as electrical insulating failure can significantly be decreased as compared with the prior art even in case of semiconductor devices having MOS structure or PN junction which are liable to generate leak current, whereby high reliability can be ensured for a long term.

The following Examples are set forth for illustration of the present invention as well as the advantages thereof. There are also shown epoxy resin encapsulation type semiconductor devices of prior art as Comparison examples, in order to clarify by way of comparison the excellent humidity resistance, electrical characteristics and reliability. But these Examples should not in any sense be construed as limiting the present invention.

EXAMPLES

There are prepared various epoxy resin encapsulation type semiconductor devices, which were provided for tests including pressure cooker test (PCT), bias-PCT, high temperature electrical characteristic tests or others for investigation about humidity resistance, high temperature electrical characteristics, etc. Unless otherwise noted, all of the epoxy resins employed contain a hydrolyzable chlorine of not higher than 0.1% by weight with a chlorine ion content of 10 ppm or less.

EXPERIMENT 1

Volume resistivity

A composition comprising 100 parts by weight of a cresol novolac type epoxy resin with an epoxy equivalent of 220, 50 parts by weight of a phenol novolac resin having a molecular weight of 750 and a hydroxyl equivalent of 103, 1 part by weight of triphenylphosphine, 370 parts by weight of quartz glass powders, 3 parts by weight of carnauba wax and 2 parts by weight of carbon black was homogeneously mixed and thereafter kneaded on a heated roll mill. Then, after cooling, the resultant mass was pulverized to prepare an epoxy resin composition. This composition was molded at 170° C. for 3 minutes, followed by curing at 170° C. for 8 hours to obtain a molded product. Volume resistivity of this molded product was measured at 150° C. to be $5 \times 10^{14}$ Ω·cm.

For comparative purposes, there was also prepared a composition (Comparative experiment 1), in which 2 parts by weight of 2-methylimidazole were used in place of the triphenylphosphine in the above composition, and volume resistivity thereof was measured at 150° C. under the same conditions as mentioned above to be $4 \times 10^{12}$ Ω·cm.

EXPERIMENT 2

Leak current

An epoxy resin composition was prepared by mixing 100 parts by weight of a phenol novolac type epoxy resin with an epoxy equivalent of 200, 50 parts by weight of a phenol novolac resin (curing agent) having a molecular weight of 700 with an epoxy equivalent of 103 and 0.03 parts by weight of triphenylphosphine (curing accelerator).

The above epoxy resin composition was cast molded into electrodes comprising copper plates with area of 1 cm² facing each other at an interval of 1 mm, followed by curing by heating at 160° C. for 5 hours. The resulting resin encapsulated electrical parts, 20 in all, were heated at the temperatures indicated in Table 1, respectively, for one hour before measurement of the leak current between the electrodes by application of 100 V direct current therebetween in order to find out leak current failures. A leak current exceeding $1 \times 10^{-10}$ A was judged to be failure.

For comparison, there was also prepared an epoxy resin composition (Comparative experiment 2), in which 0.12 parts by weight of 2-heptadecylimidazole were mixed in place of the triphenylphosphine in the above composition. Twenty electrical parts prepared by resin encapsulation similarly as described above using this composition were tested for leak current. All of the results are set forth together in Table 1.

TABLE 1

| | High temperature electrical characteristics (Total percentage of leak current failures (%)) Temperature | | | | |
|---|---|---|---|---|---|
| Sample | 30° C. | 90° C. | 120° C. | 150° C. | 180° C. |
| Experiment 2 | 0 | 0 | 0 | 0 | 0 |
| Comparative experiment 2 | 0 | 10 | 75 | 100 | — |

EXAMPLES 1–5

There were prepared various compositions comprising the components selected from a cresol novolac type epoxy resin with an epoxy equivalent of 220 (Epoxy resin A), a bromine-containing epoxy novolac resin with an epoxy equivalent of 290 (Epoxy resin B), a curing agent of a phenol novolac resin having a molecular weight of 800 and a phenolic hydroxyl equivalent of 103, triphenylphosphine, 2-methylimidazole, quartz glass powders, carnauba wax, antimony trioxide, carbon black and a silane coupling agent (γ-glycidoxypropyltrimethoxysilane) at the ratios (parts by weight) indicated in Table 2. Each of these formulations was subjected to a series of processing steps including mixing with a mixer, kneading on a heated roll mill, pulverization after cooling, etc. to prepare a compound for transfer molding.

Using the thus prepared compounds, MOS integrated circuits were encapsulated therein by transfer molding to provide a DIP type (Dual-in-line package type) semiconductor device. Encapsulation was effected by molding the molding compound heated to 90° C. by a high frequency pre-heater at 175° C. for one minute, followed by heating at 180° C. for 4 hours. The ratio of phenolic hydroxyl groups possessed by the novolac resin/epoxy groups possessed by the epoxy resin in each Examples is also shown in Table 2.

In each of Examples and Comparative examples, the following evaluation tests were conducted using 100 samples of the resin encapsulated semiconductor devices.

(1) Humidity resistance test(bias-PCT) was performed, by which failure of aluminum wiring through corrosion was examined by application of a voltage of 10 V in a water vapor at 120° C. under 2 atm. The results are shown in Table 3.

TABLE 2

| Component | Example 1 | Example 2 | Example 3 | Example 4 | Example 5 | Comparative example 1 | Comparative example 2 |
|---|---|---|---|---|---|---|---|
| Epoxy resin A | 180 | 200 | 180 | 200 | 180 | 180 | 180 |
| Epoxy resin B | 20 | — | 20 | — | 20 | 20 | 20 |
| Phenol novolac resin | 76 | 85 | 61 | 134 | 100 | 76 | 100 |
| Triphenylphosphine | 5 | 5 | 5 | 5 | 5 | — | — |
| 2-Methylimidazole | — | — | — | — | — | 5 | 5 |
| Quartz glass powders | 645 | 665 | 610 | 780 | 700 | 645 | 700 |
| Carnauba wax | 4 | 4 | 4 | 4 | 4 | 4 | 4 |
| Antimony trioxide | 30 | 30 | 30 | 30 | 30 | 30 | 30 |
| Carbon black | 4 | 4 | 4 | 4 | 4 | 4 | 4 |
| Silane coupling agent | 4 | 4 | 4 | 4 | 4 | 4 | 4 |
| Ratio of hydroxyl groups to epoxy groups | 0.83 | 0.91 | 0.67 | 1.4 | 1.1 | 0.83 | 1.1 |

(2) A test for examination of failure occurrence through deterioration of electrical characteristics (BT test) was conducted by application of a voltage of 10 V between the source and the drain in the field region in an oven at 150° C. The results are shown in Table 4. The result with leak current of 1 μA or more is judged to be failure.

EXAMPLE 6

A composition comprising 100 parts by weight of a cresol novolac type epoxy resin with an epoxy equivalent of 240, 45 parts by weight of a phenol novolac resin having a molecular weight of 750 and a hydroxyl equivalent of 103, 1 part by weight of triphenylphosphine, 350 parts by weight of quartz glass powders, 3 parts by weight of carnauba wax and 2 parts by weight of carbon black was thoroughly mixed and thereafter kneaded on a roll mill. Then, after cooling, the resultant mass was pulverized to prepare an epoxy resin molding compound.

For comparison, there was also prepared an epoxy resin molding compound (Comparative example 6a) having a composition similar to the above composition except that 4 parts by weight of 2-ethylimidazole were employed in place of the triphenylphosphine. Further, another epoxy resin molding compound for comparative purposes (Comparative example 6b) was also prepared, using a composition comprising 100 parts by weight of a bisphenol A type epoxy resin with an epoxy equivalent of 400, 30 parts by weight of hexahydrophthalic anhydride, 2 parts by weight of triphenylphosphine, 300 parts by weight of quartz glass powders, 5 parts by weight of carnauba wax and 2 parts by weight of carbon black, under otherwise the same conditions as mentioned above.

TABLE 3

| | Bias-PCT Total failures (%) Time | | | | |
|---|---|---|---|---|---|
| Sample | 20 Hr. | 50 Hr. | 100 Hr. | 200 Hr. | 300 Hr. |
| Example 1 | 0 | 0 | 0 | 0 | 0 |
| Example 2 | 0 | 0 | 0 | 0 | 0 |
| Example 3 | 0 | 0 | 0 | 0 | 2 |
| Example 4 | 0 | 0 | 0 | 24 | 75 |
| Example 5 | 0 | 0 | 0 | 3 | 42 |
| Comparative example 1 | 82 | 100 | — | — | — |
| Comparative | 79 | 100 | — | — | — |

TABLE 3-continued

| Sample | Bias-PCT Total failures (%) Time | | | | |
|---|---|---|---|---|---|
| | 20 Hr. | 50 Hr. | 100 Hr. | 200 Hr. | 300 Hr. |
| example 2 | | | | | |

TABLE 4

| Sample | BT test Total failures (%) Time | | | | |
|---|---|---|---|---|---|
| | 10 min. | 50 min. | 100 min. | 500 min. | 1000 min. |
| Example 1 | 0 | 0 | 0 | 0 | 0 |
| Example 2 | 0 | 0 | 0 | 0 | 0 |
| Example 3 | 0 | 0 | 0 | 0 | 4 |
| Example 4 | 0 | 0 | 0 | 2 | 73 |
| Example 5 | 0 | 0 | 0 | 0 | 50 |
| Comparative example 1 | 73 | 100 | — | — | — |
| Comparative example 2 | 71 | 100 | — | — | — |

EXAMPLE 7

There was prepared an epoxy resin type composition by mixing 200 parts by weight of a phenol novolac type epoxy resin with an epoxy equivalent of 200, 20 parts by weight of a bromine-containing epoxy novolac resin, 100 parts by weight of a cresol novolac resin having a molecular weight of 800 and a hydroxyl equivalent of 117, 2 parts by weight of triphenylphosphine, 700 parts by weight of quartz glass powders, 5 parts by weight of carnauba wax, 50 parts by weight of antimony trioxide and 3 parts by weight of carbon black. The composition was treated in the same manner as in Example 6 to prepare an epoxy resin molding compound.

The above procedure was repeated except that the triphenylphosphine was replaced with 4 parts by weight of 2-heptadecylimidazole to prepare an epoxy resin molding compound (Comparative example 7), which is to be provided as a sample for comparative purpose.

Using the thus prepared molding compounds of Examples 6 and 7 and Comparative examples 6a, 6b and 7, MOS integrated circuit devices prepared for evaluation were transfer molded under the molding conditions of 175° C. and 3 minutes, followed by curing at 180° C. for 6 hours, to provide DIP type resin encapsulation type semiconductor devices. For each of the following tests, there were provided 100 resin encapsulation type semiconductor devices.

(1) A humidity resistance test (PCT) was performed, wherein the test sample was left to stand in a high temperature and high pressure water vapor at 120° C. under 2 atm. The judgement of failure was conducted by detection of corrosion in aluminum wiring.

TABLE 5

| Sample | PCT Total failures (%) Time | | | |
|---|---|---|---|---|
| | 250 Hr. | 500 Hr. | 750 Hr. | 1000 Hr. |
| Example 6 | 0 | 0 | 0 | 0 |
| Example 7 | 0 | 0 | 0 | 0 |
| Comparative example 6a | 22 | 94 | 100 | — |
| Comparative example 6b | 72 | 100 | — | — |
| Comparative example 7 | 35 | 100 | — | — |

TABLE 6

| Sample | Bias-PCT Total failures (%) Time | | | |
|---|---|---|---|---|
| | 20 Hr. | 40 Hr. | 80 Hr. | 160 Hr. |
| Example 6 | 0 | 0 | 0 | 0 |
| Example 7 | 0 | 0 | 0 | 0 |
| Comparative example 6a | 53 | 100 | — | — |
| Comparative example 6b | 0 | 42 | 100 | — |
| Comparative example 7 | 48 | 100 | — | — |

TABLE 7

| Sample | BT test Total failures (%) Time | | | |
|---|---|---|---|---|
| | 10 min. | 50 min. | 100 min. | 500 min. |
| Example 6 | 0 | 0 | 0 | 0 |
| Example 7 | 0 | 0 | 0 | 0 |
| Comparative example 6a | 88 | 100 | — | — |
| Comparative example 6b | 0 | 20 | 100 | — |
| Comparative example 7 | 75 | 100 | — | — |

(2) A humidity resistance test (bias-PCT) was performed, wherein a voltage of 15 V was applied to a test sample in a high temperature and high pressure water vapor at 120° C. under 2 atm. Failure judgement was conducted by detection of corrosion in aluminum wiring.

(3) Failure occurrence through deterioration of electrical characteristics at a high temperature was examined by application of a voltage of 10 V between the source and the drain in a hot oven at 150° C. (BT test). A leak current detected of 1 $\mu$A or higher at the field region is judged to be failure. The results of each test are shown in Tables 5 to 7, respectively.

EXAMPLE 8

A composition comprising 100 parts by weight of a cresol novolac type epoxy resin with an epoxy equivalent of 220, 40 parts by weight of a phenol novolac resin having a molecular weight of 700 and a hydroxyl equivalent of 103, 1 part by weight of 1,2-bis(diphenylphosphino)ethane, 400 parts by weight of crystalline silica powders, 2 parts by weight of carnauba wax, 2 parts by weight of calcium stearate and 2 parts by weight of carbon black was treated in the same manner as in Example 6 to prepare an epoxy resin molding compound.

There was also prepared an epoxy resin molding compound (Comparative example 8) according to the same procedure as described above, except that 2 parts by weight of benzyldimethylamine were used in place of the 1,2-bis(diphenylphosphino)ethane in the above composition.

Using the thus prepared molding compounds of Example 8 and Comparative example 8, transistor devices were prepared by low pressure transfer molding method under the molding conditions of 180° C. and 2 minutes, followed by post curing at 170° C. for 8 hours, to give resin encapsulation type transistor devices. For each of the following tests, one hundred encapsulation type transistor devices were provided.

(1) Table 8 shows the results of humidity tests (bias-PCT), wherein a reverse bias of 30 V was applied between the base and the emitter in a water vapor at 120°

C. under 2 atm. Corrosion of aluminum wiring was judged to be failure.

(2) Table 9 shows the results of BT tests, wherein leak currents were measured while applying a reverse bias of 30 V between the base and the emitter in a hot oven at 150° C. A leak current of 1 μA or more was judged to be a failure.

TABLE 8

| Sample | Bias-PCT Total failures (%) Time | | | |
|---|---|---|---|---|
| | 20 Hr. | 40 Hr. | 80 Hr. | 160 Hr. |
| Example 8 | 0 | 0 | 0 | 0 |
| Comparative example 8 | 39 | 95 | 100 | — |

TABLE 9

| Sample | BT test Total failures (%) Time | | | |
|---|---|---|---|---|
| | 20 min. | 50 min. | 100 min. | 500 min. |
| Example 8 | 0 | 0 | 0 | 0 |
| Comparative example 8 | 66 | 92 | 100 | — |

EXAMPLE 9

An epoxy resin composition was prepared by mixing 100 parts by weight of a phenol novolac type epoxy resin with an epoxy equivalent of 175, 48 parts by weight of a phenol novolac resin having a molecular weight of 500 and a hydroxyl equivalent of 103 and 0.1 part by weight of triphenylphosphine.

In the above composition, the triphenylphosphine was replaced with 0.2 part by weight of dimethylaminomethylphenol to repeat the procedure under otherwise the same conditions, whereby there was obtained another epoxy resin composition (Comparative example 9).

The thus prepared epoxy resin compositions of Example 9 and Comparative example 9 were employed for cast molding of integrated circuit devices, followed by curing at 170° C. for 5 hours, to obtain resin encapsulation type integrated circuit devices, of which 100 samples were provided for use in each of the following tests.

(1) Bias-PCT test was performed by applying a bias voltage of 15 V in a water vapor at 120° C. under 2 atm. Corrosion occurred in aluminum wiring was judged to be a failure.

(2) BT test was performed by application of a bias voltage of 15 V in a hot oven at 150° C. A leak current of 1 μA or more was judged to be a failure. The results are shown in Tables 10 and 11, respectively.

TABLE 10

| Sample | Bias-PCT Total failures (%) Time | | | |
|---|---|---|---|---|
| | 20 Hr. | 40 Hr. | 80 Hr. | 160 Hr. |
| Example 9 | 0 | 0 | 0 | 0 |
| Comparative example 9 | 57 | 100 | — | — |

TABLE 11

| Sample | BT test Total failures (%) Time | | | |
|---|---|---|---|---|
| | 10 min. | 50 min. | 100 min. | 500 min. |
| Example 9 | 0 | 0 | 0 | 0 |
| Comparative example 9 | 70 | 100 | — | — |

To the epoxy resin compositions of Example 9 and Comparative example 9, there were added organic solvents to lower their viscosities until solutions thereof were obtained, respectively. By use of these solutions, coatings were applied on the surface of the integrated circuit devices. After evaporation of the solvent, followed by curing under heating at 180° C. for 5 hours, there were obtained semiconductor devices coated with resins. One hundred samples for each example were subjected to the BT test wherein a bias voltage of 15 V was applied in a hot oven at 150° C. to give the results as shown in Table 12. A leak current between the source and the drain at the field region of 1 μA or more was judged to be failure.

TABLE 12

| Sample | BT test Total failures (%) Time | | | |
|---|---|---|---|---|
| | 10 min. | 50 min. | 100 min. | 500 min. |
| Example 9 | 0 | 0 | 0 | 0 |
| Comparative example 9 | 68 | 100 | — | — |

We claim:

1. A resin encapsulation type semiconductor device comprising a semiconductor device encapsulated within a cured epoxy resin composition, said epoxy resin composition comprising (a) an epoxy resin containing a hydrolyzable chlorine in an amount less than 0.1% by weight, (b) a novolac resin containing phenolic hydroxyl groups in a ratio of about 0.5 to about 1.5 relative to the epoxy groups possessed by said epoxy resin, and (c) 0.001 to 20 parts by weight of an organic tertiary phosphine compound per 100 parts by weight of the sum of said epoxy resin and said novolac resin.

2. A device according to claim 1, wherein the epoxy resin composition further contains an inorganic filler.

3. A device according to claim 2, wherein the inorganic filler is silica powders and/or quartz glass powders.

4. A device according to claim 1, wherein the epoxy resin is a novolac type epoxy resin with an epoxy equivalent of 170 to 300.

5. A device according to claim 1, wherein the the ratio of the phenolic hydroxyl groups possessed by the novolac resin to the epoxy groups possessed by the epoxy resin is at least 0.5 but less than 1.

6. A device according to claim 5, wherein said ratio is in the range of 0.77 to 0.95.

7. A device according to claim 1, wherein the organic tertiary phosphine compound is a triarylphosphine or a bis(diarylphosphino)alkane with an alkane moiety of 1 to 20 carbon atoms.

8. A device according to claim 7, wherein the organic tertiary phosphine is triphenylphosphine, 1,2-bis(diphenylphosphino)ethane or bis(diphenylphosphino)methane.

9. A device according to claim 1, wherein the epoxy resin is a novolac type epoxy resin with an epoxy equivalent of 170 to 300 and the organic tertiary phosphine compound is a triarylphosphine or a bis(diarylphosphino)alkane with an alkane moiety of 1 to 20 carbon atoms.

10. A device according to claim 1, wherein the epoxy resin is a novolac type epoxy resin with an epoxy equivalent of 170 to 300, the organic tertiary phosphine compound is a triarylphosphine or a bis(diarylphosphino)alkane with an alkane moiety of 1 to 20 carbon atoms, and the ratio of the phenolic hydroxyl groups possessed by the novolac resin to the epoxy groups possessed by the epoxy resin is at least 0.5 but less than 1.

11. A device according to claim 1, wherein the epoxy resin contains chlorine ion in an amount of about 10 ppm or less.

12. A device according to claim 1, wherein the epoxy resin is a glycidyl ether type epoxy resin.

* * * * *